United States Patent
Yoneda

(10) Patent No.: US 9,403,316 B2
(45) Date of Patent: Aug. 2, 2016

(54) PATTERN FORMING METHOD AND PATTERN FORMING APPARATUS

(71) Applicant: Kabushiki Kaisha Toshiba, Tokyo (JP)

(72) Inventor: Ikuo Yoneda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 59 days.

(21) Appl. No.: 14/311,404

(22) Filed: Jun. 23, 2014

(65) Prior Publication Data
US 2014/0300018 A1   Oct. 9, 2014

Related U.S. Application Data

(62) Division of application No. 12/180,168, filed on Jul. 25, 2008, now abandoned.

(51) Int. Cl.
| | |
|---|---|
| B29C 59/02 | (2006.01) |
| B82Y 10/00 | (2011.01) |
| B82Y 40/00 | (2011.01) |
| G03F 7/00 | (2006.01) |
| B29C 59/00 | (2006.01) |
| B29L 31/34 | (2006.01) |

(52) U.S. Cl.
CPC ............ *B29C 59/022* (2013.01); *B29C 59/002* (2013.01); *B82Y 10/00* (2013.01); *B82Y 40/00* (2013.01); *G03F 7/0002* (2013.01); *B29C 2059/023* (2013.01); *B29L 2031/34* (2013.01)

(58) Field of Classification Search
CPC ............ B29C 59/022; B29C 2059/023; B29C 59/002; B82Y 10/00; B82Y 40/00; B29L 2031/34; G03F 7/0002
USPC .................. 264/40.5, 293, 40.7, 294, 298
See application file for complete search history.

(56) References Cited

U.S. PATENT DOCUMENTS

| | | |
|---|---|---|
| 5,772,905 A | 6/1998 | Chou |
| 6,696,220 B2 | 2/2004 | Bailey et al. |
| 6,900,881 B2 | 5/2005 | Sreenivasan et al. |

(Continued)

FOREIGN PATENT DOCUMENTS

| | | |
|---|---|---|
| JP | 2000-194142 | 7/2000 |
| JP | 2001-068411 | 3/2001 |

(Continued)

OTHER PUBLICATIONS

Yoneda et al., U.S. Appl. No. 12/018,490, filed Jan. 23, 2008.

(Continued)

*Primary Examiner* — Jacob T Minskey
*Assistant Examiner* — Vishal I Patel
(74) *Attorney, Agent, or Firm* — Finnegan, Henderson, Farabow, Garrett & Dunner LLP

(57) ABSTRACT

According to an aspect of the present invention, there is provided a pattern forming apparatus in which a mold having a pattern is brought into contact with an imprinting material on a substrate to transfer the pattern, the apparatus including: a holding part configured to hold the mold; a moving part configured to move the holding part so that the mold is brought into contact with the imprinting material on the substrate and that the mold is removed therefrom; and a control part configured to control so that at least one of conditions of removing the mold can be changed based on conditions of the pattern formed in the mold, the conditions including a rate and an angle of removing the mold.

7 Claims, 6 Drawing Sheets

(56) References Cited

U.S. PATENT DOCUMENTS

| | | | |
|---|---|---|---|
| 7,432,634 B2 | 10/2008 | Choi et al. | |
| 2004/0008334 A1* | 1/2004 | Sreenivasan et al. | 355/72 |
| 2005/0260295 A1* | 11/2005 | Choi et al. | 425/149 |
| 2008/0090170 A1 | 4/2008 | Yoneda | |

FOREIGN PATENT DOCUMENTS

| | | |
|---|---|---|
| JP | 2003-077807 | 3/2003 |
| JP | 2005-153091 | 6/2005 |
| WO | WO 2006/082867 | 8/2006 |

OTHER PUBLICATIONS

Notification of Reasons for Refusal issued by the Japanese Patent Office on Jan. 4, 2012, for Japanese Patent Application No. 2007-016803, and English-language translation thereof.

* cited by examiner

PATTERN FORMING METHOD AND PATTERN FORMING APPARATUS

This is a division of application Ser. No. 12/180,168, filed Jul. 25, 2008, which is incorporated herein by reference.

BACKGROUND OF THE INVENTION

1. Field of the Invention

An aspect of the present invention relates to a pattern forming method and a pattern forming apparatus.

2. Description of the Related Art

In the fabrication steps of semiconductor devices, in order to implement the processability and mass production of devices with fine patterns of 100 nm or below, for example, attention is focused on a nanoimprint lithography technique in which a patterned mold is brought into contact with a substrate such as a wafer for pattern transfer.

In the nanoimprinting method, an original plate (mold) having a pattern on one surface thereof is brought into contact with an imprinting material such as a resist layer coated on a substrate and the imprinting material is then cured, whereby the pattern is transferred.

For example, as the nanoimprinting method, the following methods are known: thermal imprinting methods using a thermoplastic resist disclosed in U.S. Pat. No. 5,772,905-B and JP-2003-77807-A, described later, and photo-imprinting methods using a photo-curing resist disclosed in JP-2001-68411-A and JP-2000-194142-A, described later.

As one example of the nanoimprinting method, the outline of a flow of pattern transfer according to a photo-imprinting method will be described.

The photo-imprinting method includes the following steps:
(1) applying a photo-curing resin onto a substrate,
(2) aligning a mold with a substrate and bringing them contact with each other,
(3) curing the resin with photoirradiation,
(4) removing the mold, and
(5) removing a remaining film.

Here, in removing the remaining film, anisotropic etching with oxygen plasma has been mainly performed.

In semiconductor lithography, by a demand for processing a base film after pattern formation, the height of a required pattern is defined. In photolithography, the height of the pattern after developed can be chiefly determined by the thickness of an applied resist film. In addition to this, although it is necessary to take into account of resist deformation caused by surface tension, for example, in developing and drying the resist, it is possible to satisfy the demand for processing the to-be-processed film in most cases.

However, in the nanoimprinting method, in the step of removing the mold contacted with the imprinting material on the substrate, it is necessary to remove the mold from the imprinting material in which the pattern is hardened.

Here, between the pattern and the mold, friction works depending on the contact area between them. The tensile strength of the imprinting material made of a resin becomes weakened as the width of the pattern becomes narrower.

Therefore, in the pattern with a narrow width and a high height, that is, in the pattern with a high aspect ratio, such a defect that the pattern may be broken when removing the mold.

In addition, when the adhesion between the imprinting material and the base substrate, or the adhesion of the individual interlayers in a multilayer structure of the base substrate is week, peelings may occur in the interface of the weakest adhesion.

SUMMARY OF THE INVENTION

According to an aspect of the present invention, there is provided a pattern forming apparatus in which a mold having a pattern formed thereon is brought into contact with an imprinting material on a process surface of a substrate to transfer the pattern, the apparatus including: a holding part configured to hold the mold; a moving part configured to move the holding part in such a way that the mold is brought into contact with the imprinting material on the substrate, or the mold is removed therefrom; and a control part configured to conduct control in such a way that at least one of conditions of removing the mold can be changed based on conditions of the pattern formed in the mold, the conditions including a rate of removing the mold of the moving part and an angle of removing the mold between the mold and the substrate in removing the mold.

According to another aspect of the present invention, there is provided a pattern forming method in which a mold having a pattern formed thereon is brought into contact with an imprinting material on a process surface of a substrate to transfer the pattern, the method including: changing at least one of conditions of removing the mold for imprinting in moving the mold in such a way that the mold is removed from the substrate for testing, the conditions including a rate of removing the mold and an angle of removing the mold between the mold and the substrate; checking a defect on the imprinted substrate and inspecting a relation between the number of defects and the conditions of removing mold to set an optimum condition of removing the mold; and imprinting the pattern on the substrate for a product in accordance with the optimum condition of removing the mold.

DETAILED DESCRIPTION OF THE INVENTION

First, the steps of a typical photo-imprinting method will be described.

Figure 1:
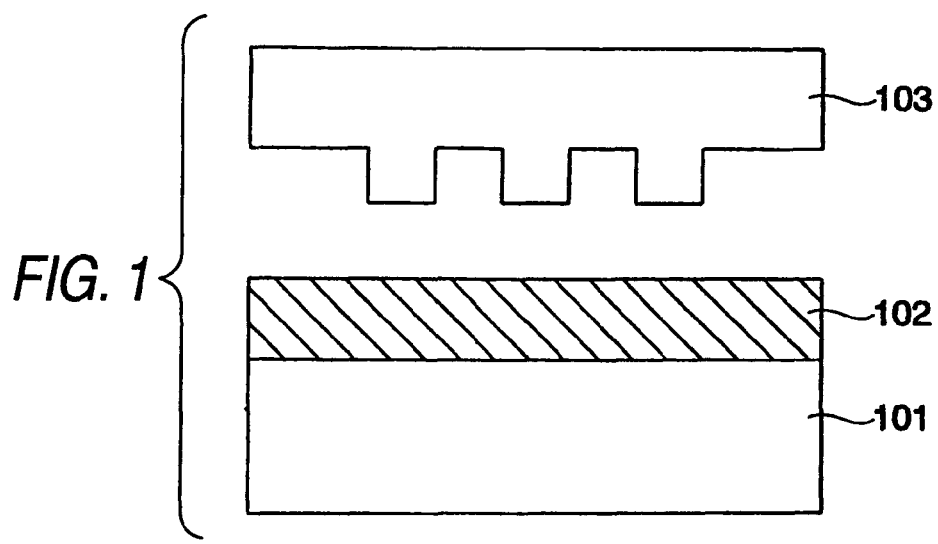
FIG. 1 shows a vertical cross section depicting a substrate and a mold in a step of a photo-imprinting method.

As shown in FIG. 1, onto the process surface of a substrate 101, a resist layer 102 formed of a photo-curing resin, for example, is applied as an imprinting material. A mold 103 that is an original plate having a pattern to be transferred on one surface is aligned with the resist layer 102, and then brought into contact with and pressed against the resist layer 102.

Figure 2:
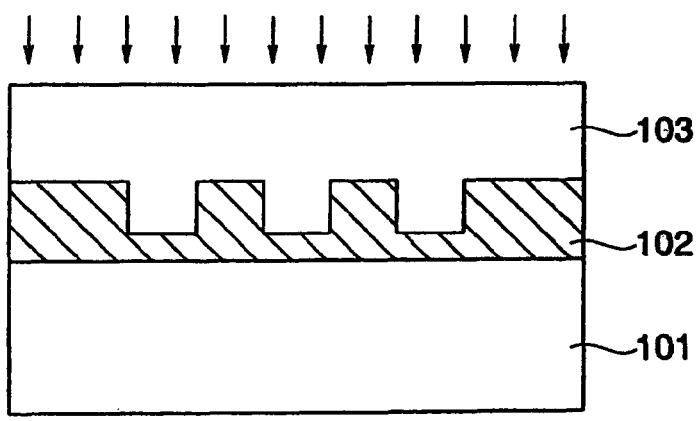
FIG. 2 shows a vertical cross section depicting the substrate and the mold in a step of the photo-imprinting method.
Figure 3:
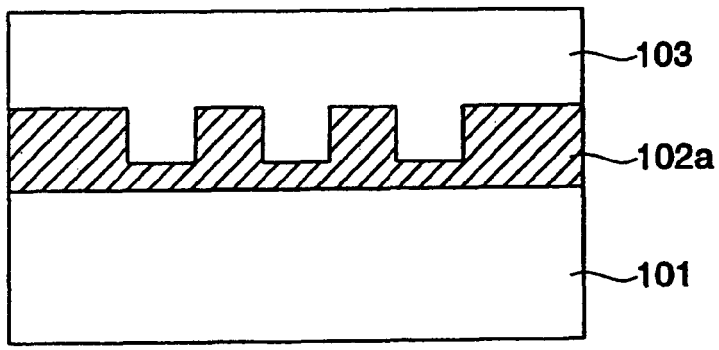
FIG. 3 shows a vertical cross section depicting the substrate and the mold in a step of the photo-imprinting method.

As shown in FIG. 2, the resist layer 102 is subjected to photoirradiation and cured, and as shown in FIG. 3, a pattern is transferred to a resist layer 102a.

Figure 4:
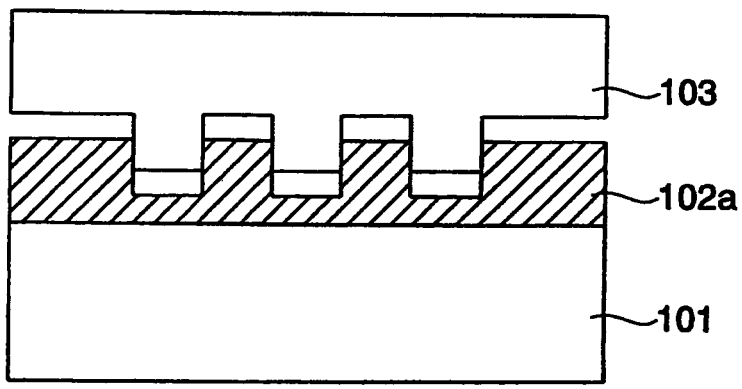
FIG. 4 shows a vertical cross section depicting the substrate and the mold in a step of the photo-imprinting method.
Figure 5:
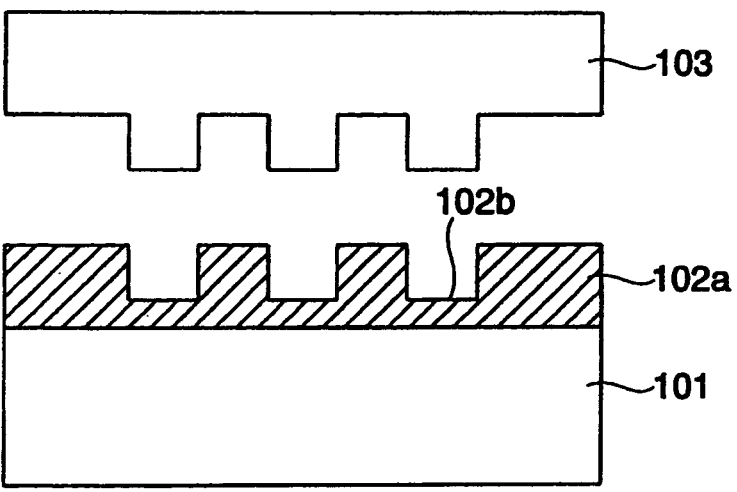
FIG. 5 shows a vertical cross section depicting the substrate and the mold in a step of the photo-imprinting method.

As shown in FIGS. 4 and 5, the mold 103 is removed from the resist layer 102a.

Figure 6:
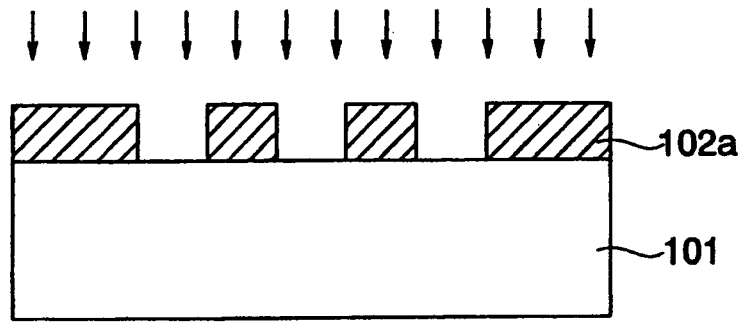
FIG. 6 shows a vertical cross section depicting the substrate and the mold in a step of the photo-imprinting method.

As shown in FIG. 6, by anisotropic etching with oxygen plasma, for example, a remaining resist layer 102b on the substrate 101 shown in FIG. 5 is removed.

In the step of removing the mold shown in FIG. 4, it is necessary to remove the mold 103 from the pattern transferred to the resist film 102a. At this time, between the pattern and the mold 103, friction works depending on the contact area between them.

Figure 7:
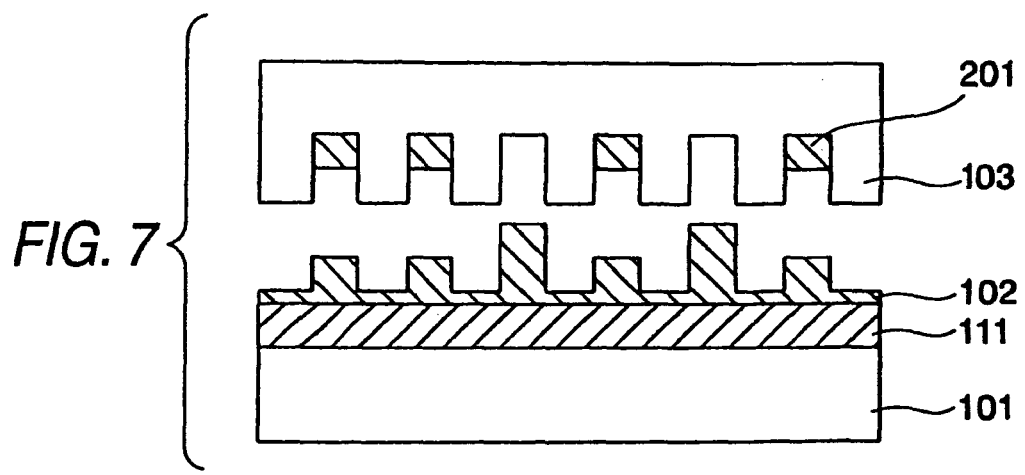
FIG. 7 shows a vertical cross section depicting an exemplary defect caused by the photo-imprinting method.

The tensile strength of the resin forming the resist layer 102a becomes weakened as the width of the pattern becomes narrower. Therefore, in the pattern with a narrow width and a high height, that is, in the pattern with a high aspect ratio, as shown in FIG. 7, as 201 depicted in the drawing, it is likely to find such a defect that the pattern in the resist film 102 is broken at some midpoint of the pattern in removing the mold.

Figure 8:
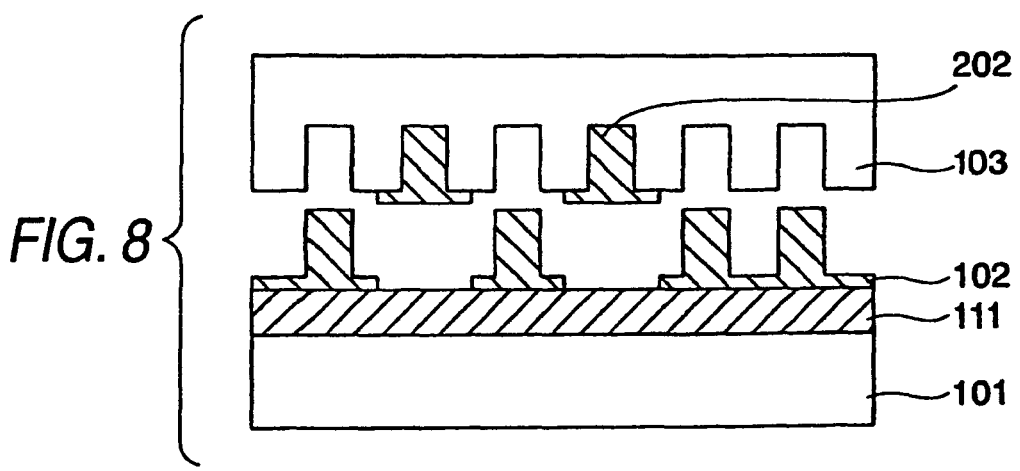
FIG. 8 shows a vertical cross section depicting an exemplary defect caused by the photo-imprinting method.
Figure 9:
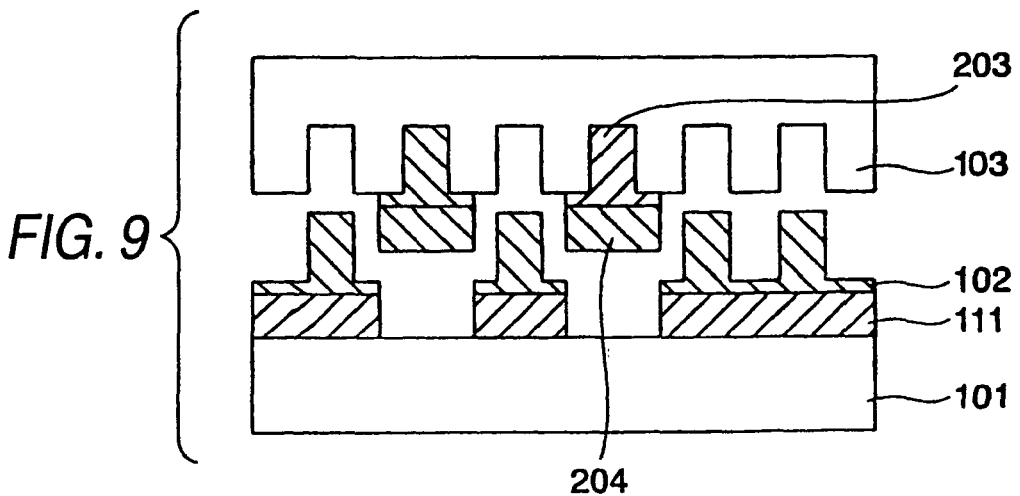
FIG. 9 shows a vertical cross section depicting an exemplary defect caused by the photo-imprinting method.

Or, as shown in FIG. 8, in the case in which the adhesion between the resist film 102 and a film 111 on the substrate 101 which is a target for processing is smaller than the friction described above, as 202 depicted in the drawing, peelings occur in the interface therebetween. Further, as shown in FIG. 9, as 203 and 204 depicted in the drawing, in the case in which the adhesion between the substrate 101 and the film 111 is small, peelings occur in the interface therebetween.

For these phenomena, the inventor of this application focuses attention on this point that the limit strength at which the imprinting material is peeled off and the limit strength at which the pattern is broken depend on the rate of removing the mold and the angle of removing the mold.

Hereinafter, a pattern forming method and a pattern forming apparatus using a photo-imprinting method according to an embodiment of the invention will be described with reference to the drawings.

Figure 10:
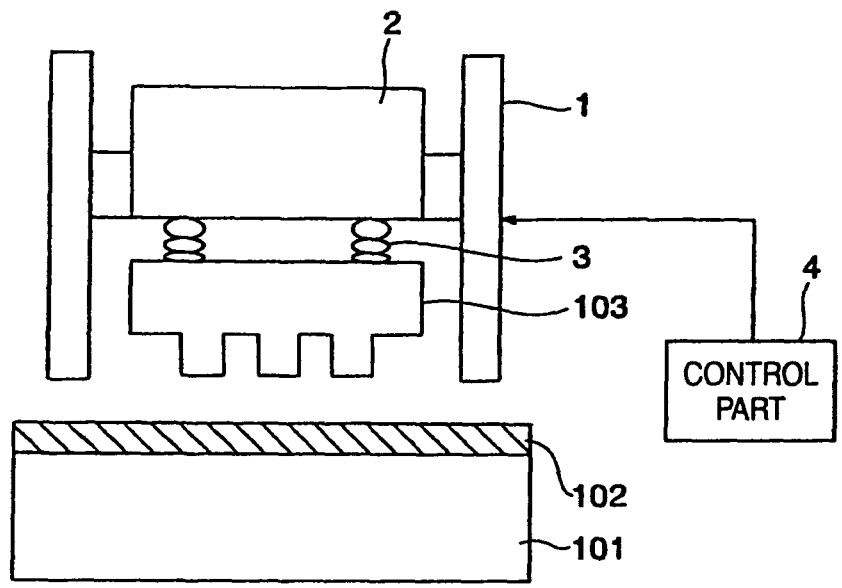
FIG. 10 shows a vertical cross section depicting a step of the pattern forming method according to an embodiment of the invention.

FIG. 10 shows the configuration of a pattern forming apparatus according to the embodiment. The pattern forming apparatus has a cabinet 1, a moving part 2 that is vertically moved relatively to the cabinet 1, a holding part 3 that is mounted in such a way that its angle can be varied with respect to the moving part 2 for holding a mold 103 so that the holding part 3 can adjust the angle of the mold 103, and a control part 4 that controls the overall operation including the rate of moving the moving part 2 and the angle of holding the mold 103 by the holding part 3.

First, as shown in FIG. 10, an imprinting material 102 is applied onto the process surface of a substrate 101, and the mold 103 is aligned in its plan direction above the imprinting material 102.

Figure 11:
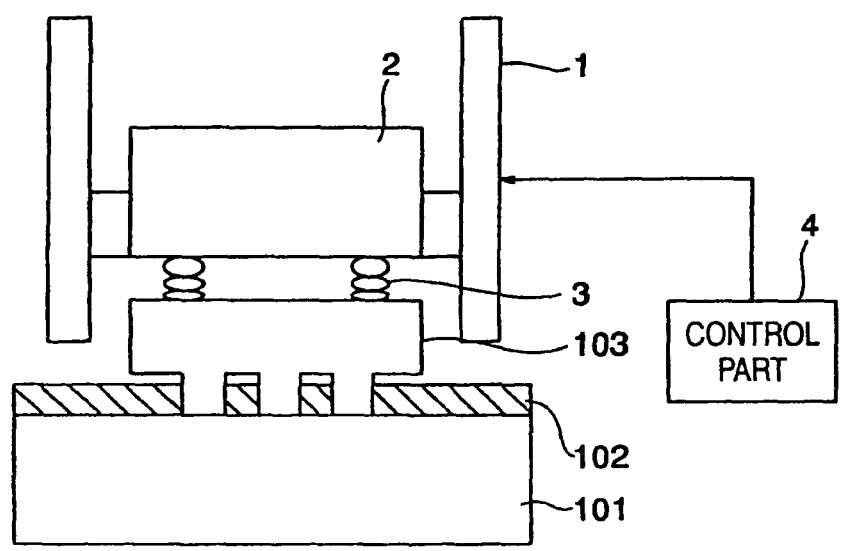
FIG. 11 shows a vertical cross section depicting a step of the pattern forming method according to the embodiment.

As shown in FIG. 11, the moving part 2 is move downward, and the mold 103 is brought into contacted with the imprinting material 102 and pressed against it.

Figure 12:
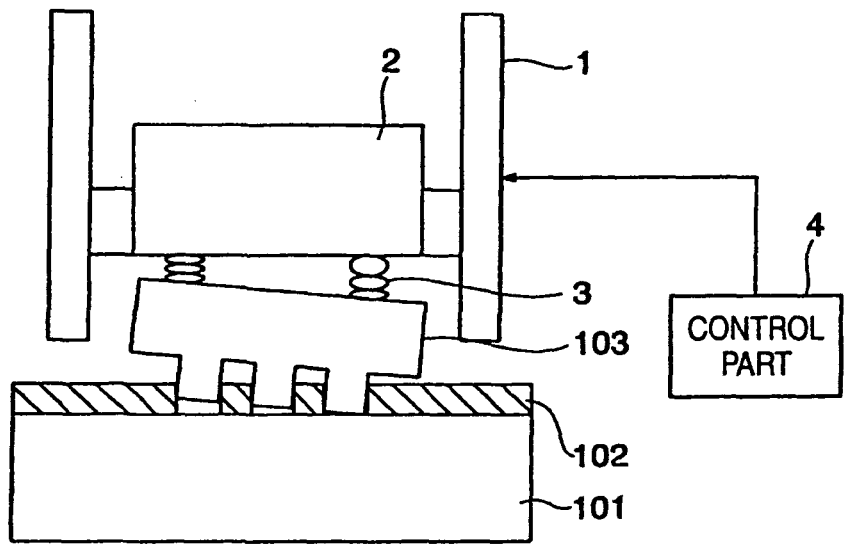
FIG. 12 shows a vertical cross section depicting a step of the pattern forming method according to the embodiment.

As shown in FIG. 12, the moving part 2 is moved upward, and the mold 103 is pulled up from the imprinting material 102 and removed therefrom. In the process of removing the mold, the control part 4 controls the rate of removing the mold 103 and the relative angle of removing the mold between the mold 103 and the imprinting material 102.

Control may be performed in such a way that the rate of removing the mold and the angle of removing the mold are optimized for each of a plurality of shots in the same substrate 101 as necessary.

Figure 13:
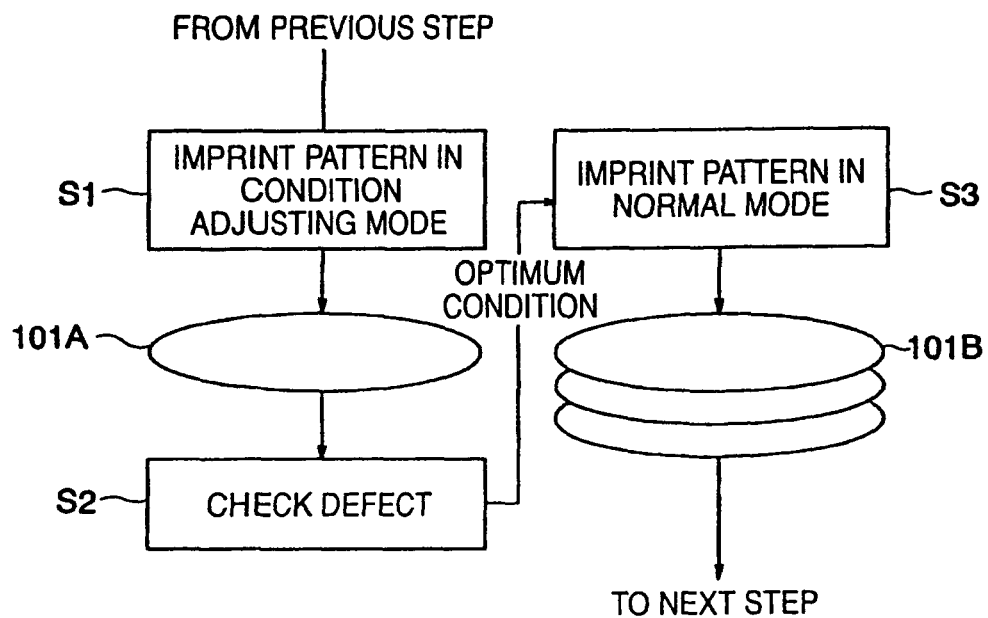
FIG. 13 shows a flow chart depicting the procedure of processing in the pattern forming method according to the embodiment.

The pattern forming method according to the embodiment will be described with reference to a flow chart shown in FIG. 13.

In Step S1, in order to detect an optimum condition of removing the mold, in a condition adjusting mode in which the rate of removing the mold and the angle of removing the mold are varied for individual shots, a substrate 101A for testing is used for imprinting to perform a mold removing process based on various conditions of removing the mold.

In Step S2, the existence of the pattern defect in the imprinting material caused by removing the mold, and the form and the cause thereof are checked. Thus, the optimum condition of removing the mold is detected.

In Step S3, a substrate 101B for a product is subjected to the imprinting process, and the mold is removed based on the optimum condition of removing the mold. In the steps after this, the imprinting material to which the pattern is transferred is used for processing.

Figure 14:
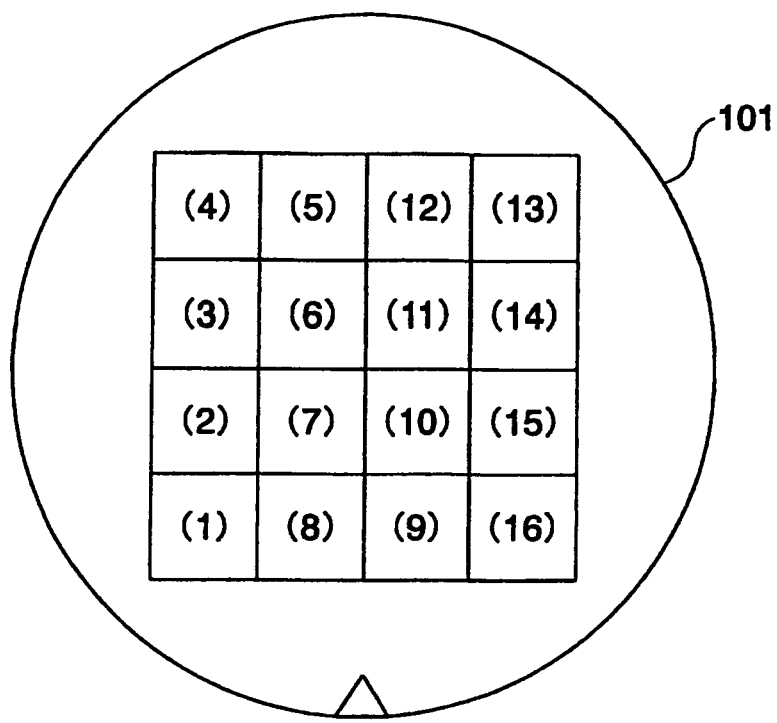
FIG. 14 shows a plan view depicting the arrangement and sequence of the shots of the pattern forming method according to the embodiment.

FIG. 14 shows the arrangement and sequence of shots when the imprinting process is in turn performed for a single substrate 101A in 16 shots, for example, as the conditions of removing the mold are varied.

Figure 15:
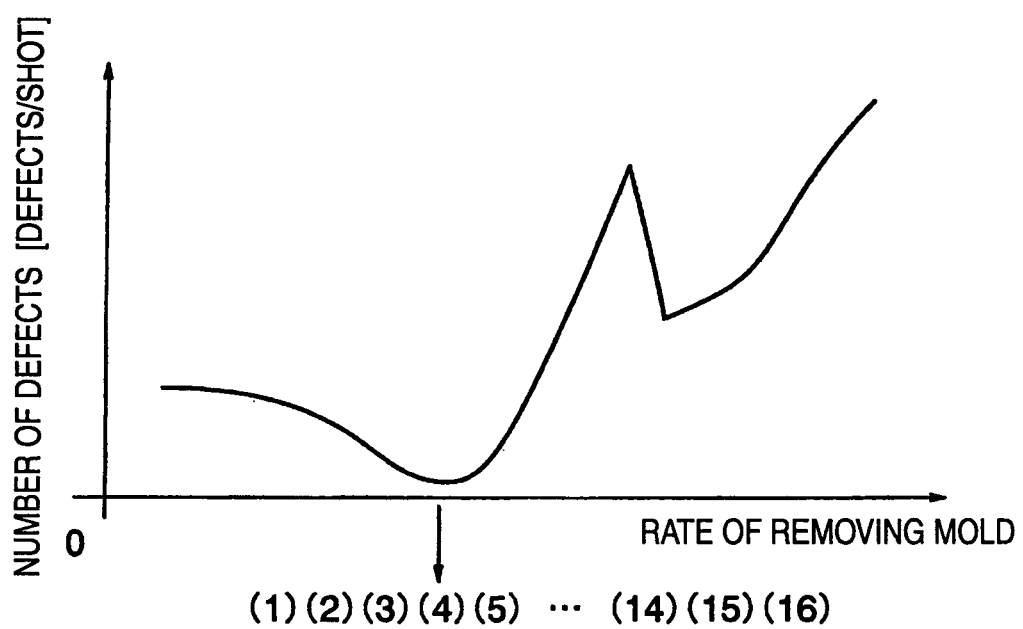
FIG. 15 shows a graph depicting the results of studying the relation between the rate of removing the mold and the number of defects.

In addition, FIG. 15 shows the results that the rate of removing the mold for individual shots is plotted against the number of defects detected in the individual shots. In the graph shown in FIG. 15, it is revealed that the number of defects is smallest at the rate of removing the mold in the fourth shot.

Similarly, the relation between the angle of removing the mold and the number of defects is found for individual shots, and the angle of removing the mold with the smallest number of defects is determined. Then, the optimum rate of removing the mold and the optimum angle of removing the mold are set, and these conditions of removing the mold are used in the imprinting process in the Step S3.

The conditions, such as the rate and the angle of removing the mold are determined based on the size (width or pitch) of the pattern formed on the mold. The size of pattern may be set as the minimum or average size according to the design rule. During removing the mold in a tilted condition, the pattern transferred on the imprinting material is stressed in a horizontal direction that is parallel to the substrate and the pattern may fall down.

When the angle of removing the mold is large, the stress against the pattern formed on the substrate becomes large. Therefore, the angle of removing the mold may be set at a small value when forming a fine pattern.

When the size of the pattern is small, the angle of removing the mold may be set small to prevent the pattern from being broken by the force applied in the horizontal direction. Contrary, when the size of the pattern is relatively-large, since the rigidity of the pattern in the horizontal direction is larger as compared with the case when the small pattern is formed, the angle of removing the mold can be set relatively-large.

In the embodiment, the relationship between the angle of removing the mold and the size of the pattern may be experimentally measured in advance, and the optimum angle may be set when the pattern is transferred on the imprinting material, thereby a sufficient transferring property can be achieved.

The rate of removing the mold also relates to the stress applied on the pattern. Therefore, the relationship between the rate of removing the mold and the size of the pattern may be experimentally measured in advance, and the optimum rate may be set when the pattern is transferred on the imprinting material, thereby a sufficient transferring property can be achieved.

The relationship between both the angle and the rate of removing the mold and the size of the pattern may be experimentally measured in advance, and the optimum angle and the optimum rate may be set when the pattern is transferred on the imprinting material, thereby a sufficient transferring property can be achieved.

Further, in addition to the size, conditions, such as density, depth or the like of the pattern formed in the mold may be considered. That is, the relationship between the mold removing condition including a rate, an angle and the like and the pattern condition including a size, density, a depth and the like may be experimentally measured in advance, and the optimum mold removing condition may be set when the pattern is transferred on the imprinting material, thereby a sufficient transferring property can be achieved.

According to the embodiment described above, at least one of the variable conditions including the rate and the angle of removing the mold is changed for individual shots or every substrate, whereby the optimum condition is found in advance. In the imprinting process after that, the mold removing process is conducted in accordance with the optimized condition, whereby defects, such as pattern destruction or the peelings of the film of the base substrate caused by the mold removing process can be avoided, and yields can be improved.

The embodiment described above is only examples, which will not limit the invention and can be variously modified within the technical scope of the invention. For example, in the embodiment, the rate of removing the mold and the angle of removing the mold are optimized as the conditions of removing the mold, but the conditions are not limited thereto, which may include the temperature of the substrate in removing the mold, for instance, as another condition.

What is claimed is:

1. A device manufacturing method, comprising:
   preparing a mold having a pattern formed thereon and a substrate on a surface of which an imprinting material is applied;
   performing a first shot of imprinting by bringing the mold into contact with the imprinting material on the substrate at a first portion to transfer the pattern thereto, and removing the mold therefrom at a first rate as a mold removal rate; and
   performing a second shot of imprinting by bringing the mold into contact with the imprinting material on the substrate at a second portion to transfer the pattern thereto, and removing the mold therefrom at a second rate as the mold removal rate,
   wherein the second portion on the substrate is different from the first portion on the substrate, and the second rate is different from the first rate.

2. The device manufacturing method according to claim 1, further comprising:
   checking a defect on the imprinting material after performing the first shot of imprinting.

3. The device manufacturing method according to claim 2, wherein checking the defect on the imprinting material includes checking the number of the defects on the imprinting material.

4. The device manufacturing method according to claim 1, wherein the mold removal rate for the first shot of imprinting is set based on a size of the pattern.

5. The device manufacturing method according to claim 1, wherein the mold removal rate for the first shot of imprinting is set based on a density of the pattern.

6. The device manufacturing method according to claim 1, wherein the mold removal rate for the first shot of imprinting is set based on at least one of a depth and a height of the pattern.

7. The device manufacturing method according to claim 2, further comprising performing a third shot of imprinting based on a result of checking the defect.

* * * * *